(12) United States Patent
Lin et al.

(10) Patent No.: US 8,929,072 B2
(45) Date of Patent: Jan. 6, 2015

(54) HEAT DISSIPATING MODULE

(75) Inventors: Wei-Yi Lin, Taipei (TW); Ting-Chiang Huang, Taipei (TW); Li-Ting Wang, Taipei (TW); Sung Nien Du, Taipei (TW)

(73) Assignee: Inventec Corporation, Taipei (TW)

( * ) Notice: Subject to any disclaimer, the term of this patent is extended or adjusted under 35 U.S.C. 154(b) by 500 days.

(21) Appl. No.: 13/332,577

(22) Filed: Dec. 21, 2011

(65) Prior Publication Data

US 2013/0141869 A1    Jun. 6, 2013

(30) Foreign Application Priority Data

Dec. 2, 2011   (TW) .............................. 100144495 A

(51) Int. Cl.
*H05K 7/20*         (2006.01)
(52) U.S. Cl.
USPC ...... 361/700; 361/679.47; 361/697; 361/710; 361/711
(58) Field of Classification Search
CPC ............... F28F 3/02; F28F 3/06; F28F 3/025; F28F 3/027
USPC ............. 361/679.32, 679.46–679.49, 679.52, 361/679.54, 697, 700, 707, 709–711, 361/719–720
See application file for complete search history.

(56) References Cited

U.S. PATENT DOCUMENTS

| 6,754,077 | B2 * | 6/2004 | Lo et al. | 361/700 |
| 6,778,392 | B2 * | 8/2004 | Chiou | 361/697 |
| 7,369,412 | B2 * | 5/2008 | Peng et al. | 361/715 |
| 7,639,503 | B2 * | 12/2009 | Tanaka | 361/719 |
| 7,649,738 | B2 * | 1/2010 | Hata et al. | 361/679.52 |
| 7,889,495 | B2 * | 2/2011 | Tachikawa | 361/679.48 |
| 8,405,997 | B2 * | 3/2013 | Fujiwara | 361/711 |
| 2002/0181200 | A1 * | 12/2002 | Chang | 361/687 |
| 2009/0080161 | A1 * | 3/2009 | Peng et al. | 361/719 |
| 2010/0165573 | A1 * | 7/2010 | Fang | 361/697 |
| 2012/0125570 | A1 * | 5/2012 | Wang et al. | 165/104.21 |

FOREIGN PATENT DOCUMENTS

| TW | I274839 | 3/2007 |
| TW | I321441 | 3/2010 |
| TW | M382514 | 6/2010 |

* cited by examiner

*Primary Examiner* — Anatoly Vortman
*Assistant Examiner* — Jacob Crum
(74) *Attorney, Agent, or Firm* — WPAT, PC; Justin King

(57) ABSTRACT

A heat dissipation module, comprising: a fan; and a heat dissipating fin; a heat conducting element, made of a conductive material, and composed of a first conductive component and two second conductive components in a manner that the first conductive component is disposed engaging with a heating element while allowing the two second conductive components to engage with the heat dissipating fin; and a wall element; wherein, the heat from the heating element is conducted to the first conductive component where it is further being dividedly conducted to the two second conductive components; and the air flow blowing from the fan is guided to the heating element and then it is blocked by the wall element for diverting the air flow toward the heat dissipating fin from an air intake side to an air outlet side, and then to be discharged out of the heat dissipating module through an outlet.

7 Claims, 7 Drawing Sheets

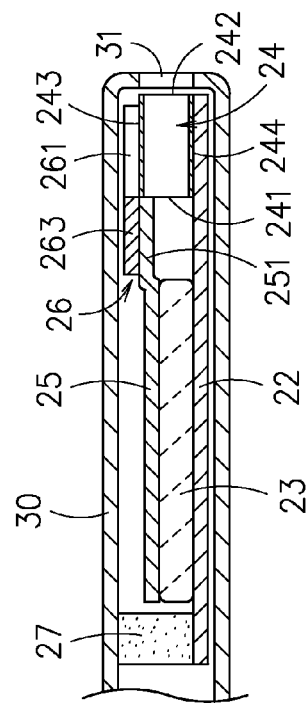
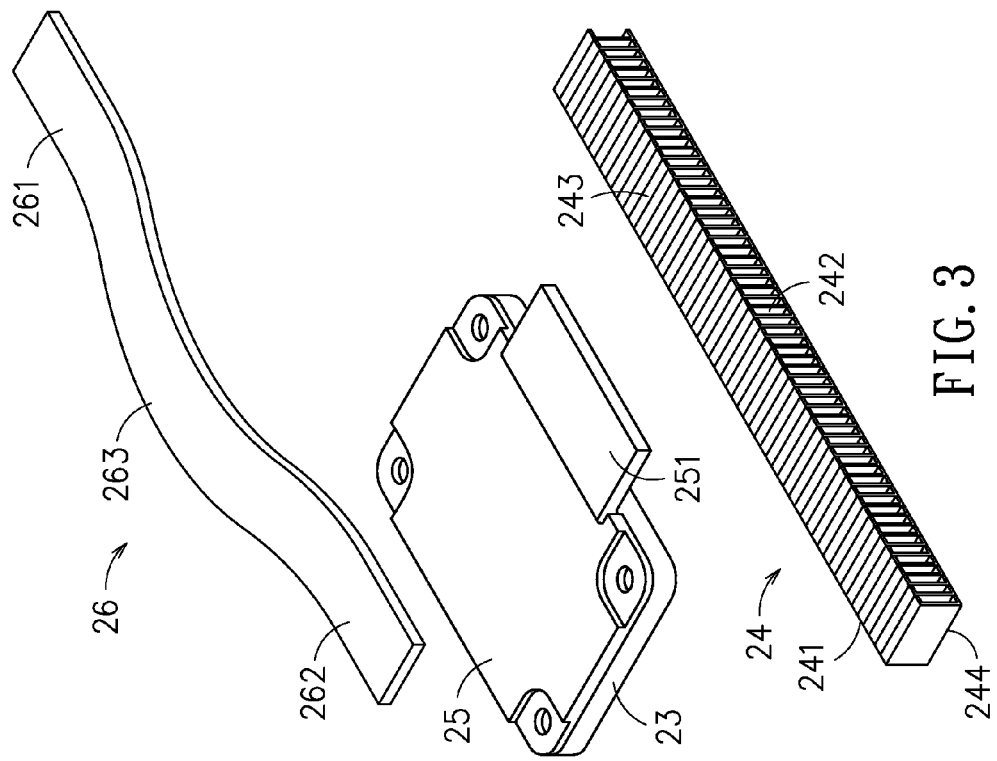

HEAT DISSIPATING MODULE

FIELD OF THE INVENTION

The present invention relates to a heat dissipating module, and more particularly, to a heat dissipating module with specific heat transfer path design, capable of enabling the heat generated from a heating element to be dividedly conducted in a Y-shaped heat transfer path to a heat dissipating, resulting that not only the heat transfer path between the heating element and the heat dissipating fin is shortened, but also the distance between the heat dissipating fin and a fan corresponding thereto is reduced, and thereby, allowing the heat emitted from the heating element to be transferred more rapidly and evenly to the heat dissipating fin so as to improve the overall performance of the heat dissipating module and also create a compact heat dissipating module that occupies less space.

BACKGROUND OF THE INVENTION

Generally, a conventional heat dissipating module that is adapted to be housed inside electronic devices is primarily composed of a fan and a heat dissipating fin in a manner that the dissipating fin is arranged at the outlet of the fan while allowing the heat dissipating fin to engage with a heating element. Operationally, when the heating element is enabled, the heat generated therefrom will be conducted and transferred to the heat dissipating fin where it is dissipated and cooled by the wind blowing from the fan, and thereafter, the hot air is discharged out of the corresponding electronic device through an air outlet for heat dissipation.

Consequently, since the heat dissipating fin is substantially a heat exchanger that transfers thermal energy from a higher temperature material to a lower temperature fluid medium, such as air, the performance of the heat dissipating fin can be optimized by enabling the cooling air flow from the fan to blow directly toward the heat dissipating fin and then to be discharged directly out of the housing through an air outlet. However, owing to the space availability and structure limitation, in most electronic devices there is no direct path for allowing the air flow from a fan to blow directly on a corresponding heat dissipating fin and then to be discharged out of the housing of the electronic device also directly through an air outlet.

Please refer to FIG. 1, which is a schematic diagram showing a conventional heat dissipating module. As shown in FIG. 1, the heat dissipating module 10 which is designed to be received inside a housing of an electronic device, is composed of a fan 11, capable of blowing an air flow from the fan 11 in a direction parallel to a first direction F1; and a heat dissipating fin 12, configured with an air intake side 121 and an air outlet side 122 that are arranged opposite to each other while enabling the air intake side 121 as well as the air outlet side 122 to be disposed perpendicular to the first direction F1, and the air outlet side 122 to face toward an air outlet. In FIG. 1, the fan 11 is disposed at an end of a circuitboard 13 for allowing a heating element 14 that is mounted on the circuitboard 13 to be sandwiched between the fan 11 and the heat dissipating fin 12. Moreover, a bar-like thermal conductive piece 15 is mounted on top of the heating element 14 and the heat dissipating fin 12, and a wall structure 16 is arranged surrounding the heating element 14 and the heat dissipating fin 12 to be used for blocking and diverting the air flow of the fan 11.

Since the heating element 14 is disposed at a position between the fan 11 and the heat dissipating fin 12, the air flow from the fan 11 that is blowing parallel to the first direction F1 is going to hit the heating element 14 before reaching the heat dissipating fin 12, and after blowing through the heating element 14, the heated air flow will be blocked by the wall structure 16 for diverting the same by about 90 degrees and thus flowing in a direction perpendicular to the first direction F1 toward the air intake side 121 of the heat dissipating fin 12 and then out of the same through the air outlet side 122. Nevertheless, simultaneously the heat generated from the operating heating element 14 is conducted to the heat dissipating fin 12 through the conduction of the thermal conductive piece 15 so as to prevent any heat accumulation occurring at the heating element 14.

In the above conventional heat dissipating module 10, the fan 11 is disposed separately from the heat dissipating fin 12 for allowing the heating element 14 to be arranged therebetween. Consequently, the fan 11 is spaced from the heat dissipating fin 12 by a distance and the cooling air flow from the fan 11 will hit the heating element 14 before reaching the heat dissipating fin 12. Therefore, the speed of the air flow is decreased considerably at the time it arrive at the heat dissipating fin 12, and thus the heat dissipation performance of the heat dissipating fin 12 is adversely affected. In addition, since the fan 11 is spaced from the heat dissipating fin 12 by a distance that can not be ignored, the whole heat dissipating module must occupies a certain space available in electronic devices that is not a good new for the miniaturization of the electronic devices.

SUMMARY OF THE INVENTION

In view of the disadvantages of prior art, the primary object of the present invention is to provide a heat dissipating module with specific heat transfer path design, capable of enabling the heat generated from a heating element to be dividedly conducted in a Y-shaped heat transfer path to a heat dissipating, resulting that not only the heat transfer path between the heating element and the heat dissipating fin is shortened, but also the distance between the heat dissipating fin and a fan corresponding thereto is reduced, and thereby, allowing the heat emitted from the heating element to be transferred more rapidly and evenly to the heat dissipating fin so as to improve the overall performance of the heat dissipating module and also create a compact heat dissipating module that occupies less space.

To achieve the above object, the present invention provides a heat dissipating module, adapted to be received inside a housing of an electronic device whereas the electronic device is composed of at least circuitboard and a heating element, and the housing is formed with at least one air outlet, the heat dissipating module comprising:

a fan, capable of blowing an air flow from the fan 11 in a direction parallel to a first direction;

a heat dissipating fin, configured with an air intake side, an air outlet side and a first surface in a manner that the air intake side and the air outlet side are arranged opposite to each other while allowing the first surface to be disposed neighboring to both the air intake side and the air outlet side, allowing the extension of the normal to the air intake side to form an included angle with the first direction, allowing the air outlet side to face toward the air outlet, and enabling the dissipating fin to be spaced from the fan by a first distance;

a heat conducting element, made of a material with heat conductivity, and composed of a first conductive component and two second conductive components in a manner that the first conductive component, being disposed at a position between the two second conductive components, is disposed engaging with the heating element while allowing the two second conductive components to engage with the first surface of the heat dissipating fin, and allowing the heat conducting element to be spaced from the fan by a second distance; and a wall element, mounted on the circuitboard for working with the housing and the circuitboard so as to form an area walling the heating element, the heat dissipating fin and the heat conducting element therein;

wherein, the heat from the heating element is conducted to the first conductive component where it is further being dividedly conducted to the two second conductive components and then to the heat dissipating fin; and the air flow blowing from the fan is guided to the heating element and the first conductive component and then it is blocked and guided by the wall element for diverting the air flow to flow toward the air intake side of the heat dissipating fin and then to an air outlet side thereof so as to be discharged out of the heat dissipating module through the air outlet.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein:

FIG. 3 is an exploded diagram showing a heat dissipating fin and a heat conducting element that are used in the first embodiment of FIG. 2.

FIG. 4 is an A-A cross sectional view of FIG. 2.

DESCRIPTION OF THE EXEMPLARY EMBODIMENTS

Figure 1:
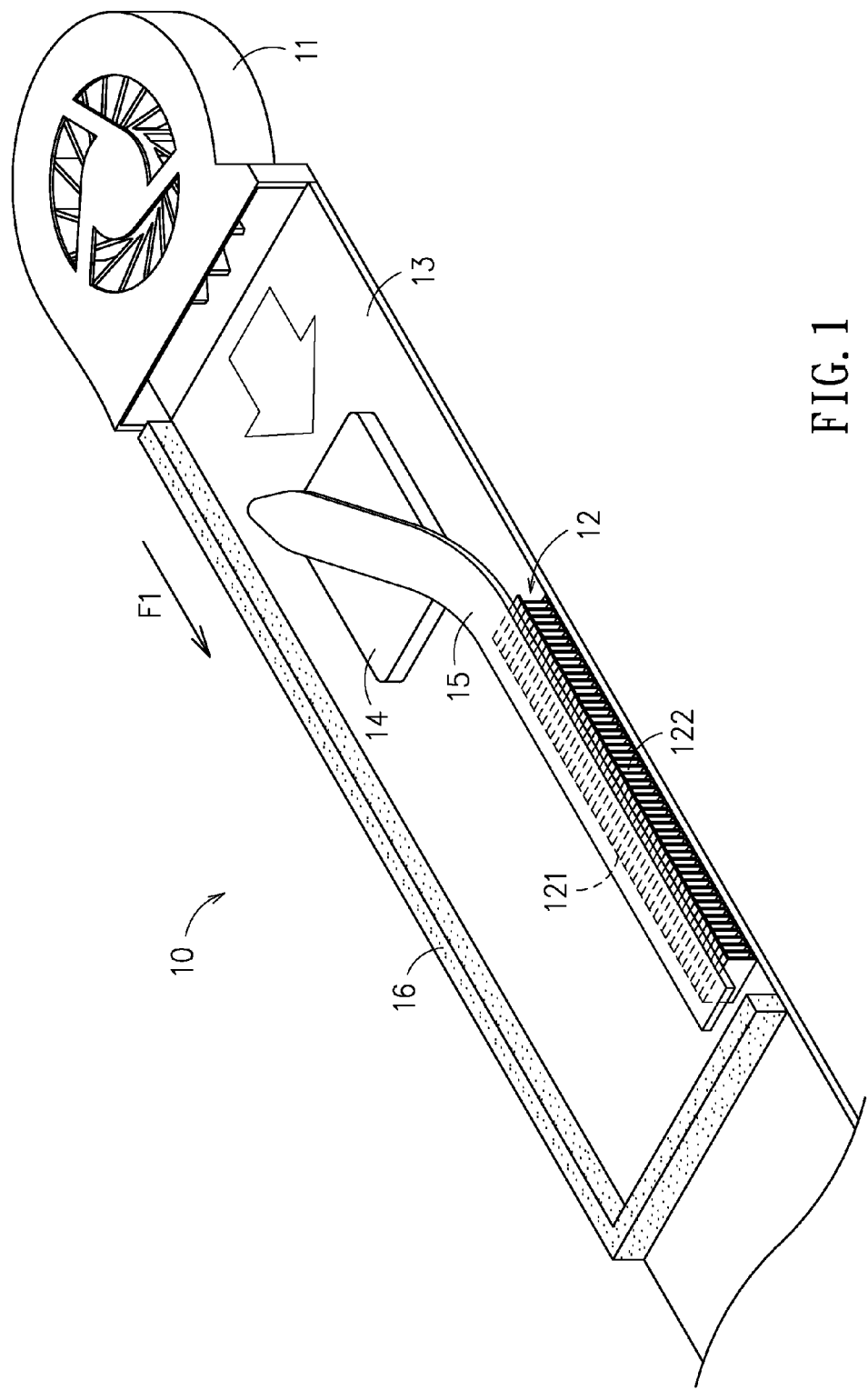
FIG. 1 is a schematic diagram showing a conventional heat dissipating module.

For your esteemed members of reviewing committee to further understand and recognize the fulfilled functions and structural characteristics of the invention, several exemplary embodiments cooperating with detailed description are presented as the follows.

In an embodiment shown in FIG. 2 to FIG. 5, a heat dissipating module is disclosed, which is adapted to be received inside a housing 30 of an electronic device whereas the housing is formed with an air outlet 31. Moreover, the heat dissipating module 20 includes a fan 21, which is used for blowing an air flow from the fan 11 in a direction parallel to a first direction F1 from an air outlet 211 to be discharged out of the fan 20. In this embodiment, the fan 21 is mounted to an end of a circuitboard 22, together with a heating element 23 and a heat dissipating fin 24 which are also mounted on the circuitboard 22, whereas the heating element 23 can be a CPU, or a DDR SDRAM, and so on. In this embodiment, the heat dissipating fin 24 is configured with an air intake side 241, and an air outlet side 242, a first surface 243 and a second surface 244, among which there are a plurality of channels formed between the air intake side 241 and the air outlet side 242 to be used as cool air tunnels while the air intake side 241 and the air outlet side 242 are arranged opposite to each other. Moreover, the first surface 243 and the second surface 244, also being arranged opposite to each other, are arranged at positions between and also next to the air intake side 241 and the air outlet side 242. That is, in this embodiment, the first surface 243 is substantially the top side of the heat dissipating fin 24 while the second surface 244 is substantially the bottom side of the same that is to be engaged with the circuitboard 22. In addition, the first surface 243 is featured by a length that is extending in a direction parallel to the first direction F1; and also the normal to the air intake side 241 is extending in a direction for allowing the normal to form an included angle with the first direction F1. As shown in FIG. 4, the facing of the air intake side 241 is about perpendicular to the first direction F1, and the air outlet side 242 is orientated facing toward the outlet 31 of the housing 30, and the heat dissipating fin is spaced from the fan 20 by a first distance.

Moreover, the heat dissipating module further comprises a heat conducting element, which is arranged on the surfaces of the heat dissipating fin 24 and the heating element 23 that are not engaged with the circuitboard 22. In this embodiment, the heat conducting element is composed of a panel 25 and a bar-like piece 26. It is noted that both the panel 25 and the bar-like piece can be made of conductive materials, such as copper. As shown in FIG. 3, the panel 25 is shaped as a flat rectangular that is disposed for allowing the same to engage with the heating element 23 by a side thereof, which can be the bottom of the panel in this embodiment. The panel 25 includes a first extension part 251, which is formed extending from a side of the panel 25 toward the air intake side 241 of the heat dissipating fin 24 by a specific length. It is noted that there is no restriction to the extending of the first extension part 251. Nevertheless, in this embodiment, the first extension part 251 is extending to an extent that allows the first extension part 251 to engage with the air intake side 241 of the heat dissipating fin 24. Moreover, the bar-like piece 26, being configured with two opposite ends 261, 262, is formed with a convex part 263 at a position between the two ends 261, 262 for allowing the profile of the bar-like piece 26 to be shaped like a V-shaped object. Thereby, the two ends 261, 262 are arranged parallel to the first direction F1 so as to be in contact with the first surface 243 of the heat dissipating fin 24 and the convex part 263 is arranged protruding out of the heat dissipating fin 24 so as to engage with the first extension part 251 of the panel 25.

In addition, the heat dissipating module further comprises: a wall element 27, that is erectly disposed on the circuitboard 22 by a height H and extending from the fan 21 toward the heating element 23 and reaching the heat dissipating fin 24 in a manner that an enclosed area can be achieved by the cooperation of the wall element 27, the fan 21 and the housing 30 for walling the heating element 23, the heat dissipating fin 24 and the heat conducting element including the panel 25 and the bar-like piece 26 therein. It is noted that the wall element 27 can be made of any material available, such as PU foam, and also there is no restriction to the shape of the wall element 27. For instance, it can be a bended structure with corners of right angles, as shown in FIG. 2, or with smooth arc-like corners, whichever is not going to act as an obstacle for the arrangement of the heating element 23 and the heat dissipating fin 24 on the circuitboard 22.

Figure 2:
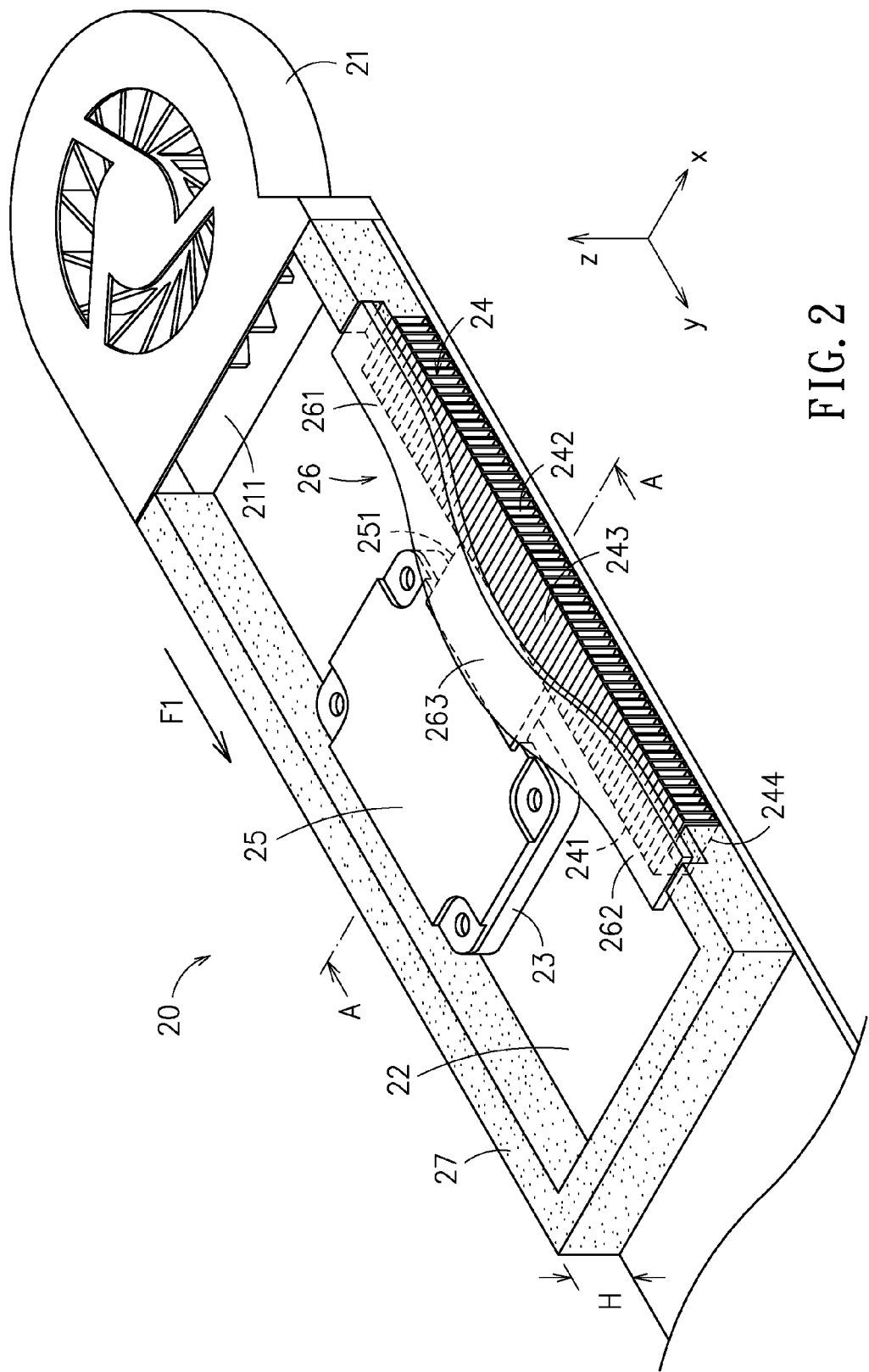
FIG. 2 is a three-dimensional diagram showing a heat dissipating module according to a first embodiment of the invention.
Figure 5:
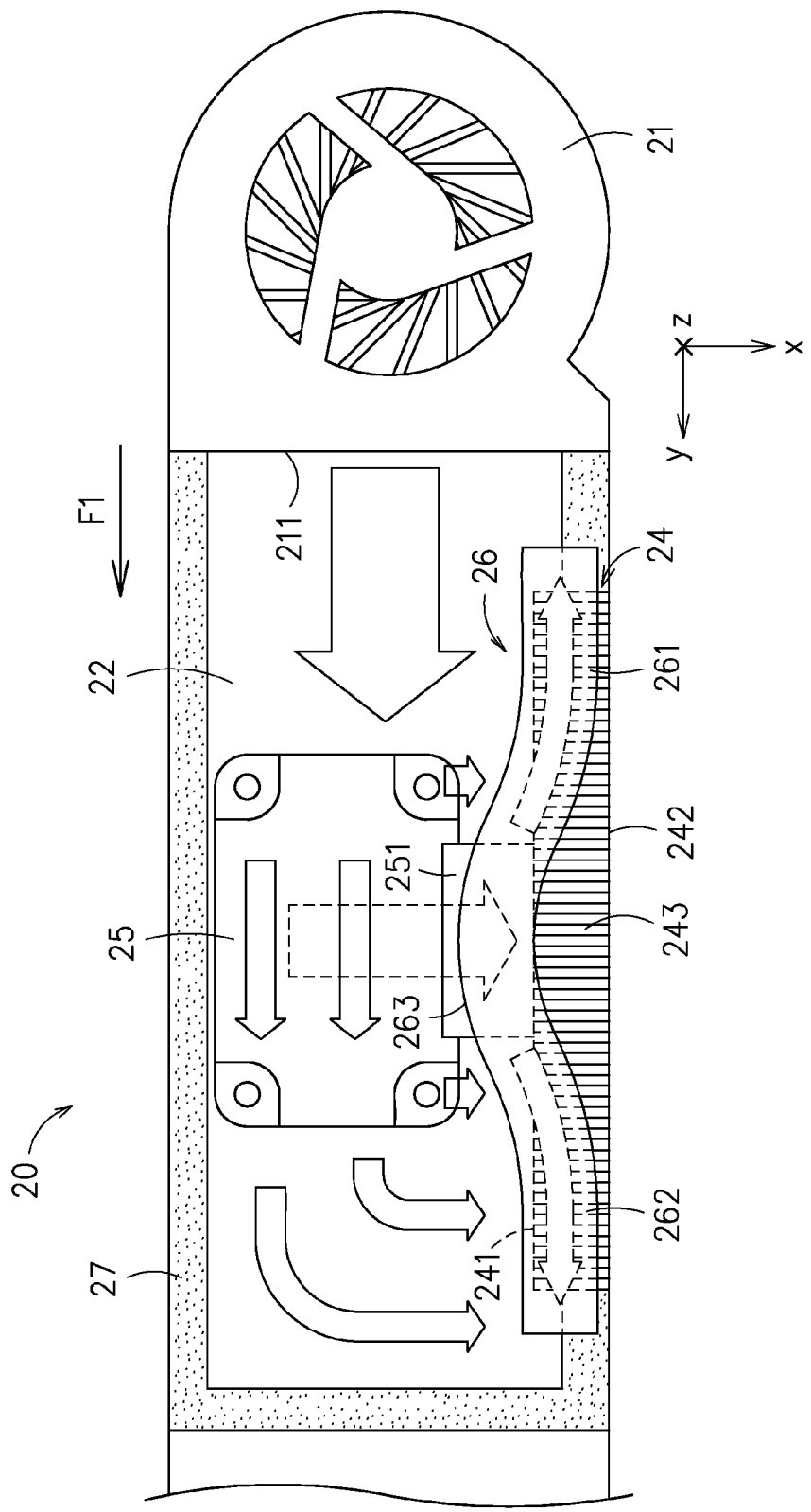
FIG. 5 is a top view of the heat dissipating module according to the first embodiment of FIG. 2 that is provided with an air blow path and the corresponding heat transfer path.

Please refer to FIG. 5, which is a top view of the heat dissipating module according to the first embodiment of FIG. 2 that is provided with an air blow path and the corresponding heat transfer path. As shown in FIG. 5, the heat generated from the heating element 23 is conducted to the panel 25 so as to be further transferred sequentially to the first extension part 261 and the convex part 263, at which the heat is divided and then to be conducted respectively to the two ends 261, 262 of the bar-like piece 26 so as to be further transferred to the heat dissipating fin 24, which is a Y-shaped heat transfer path presented as the dotted arrows in FIG. 5. In this embodiment, when the fan 21 is enabled to blow a flow of air, as the solid arrows shown in FIG. 5, the air flow will first hit the heating element 23 and the panel 25, and then is diverted toward the air intake side 241 of heat dissipating fin 24 by the guidance of the wall element 27 so as to blow through and discharge out of the heat dissipating fin 24 through the air outlet side 242 thereof, and then out of the housing through the air outlet 31 of the housing 30. Thereby, the heat generated from the heating element 23 can be conducted to the heat dissipating fin 24 evenly and rapidly that is further being cooled down by the blowing of the air flow from the fan 21, the heat of the heating element 23 can be dissipated effectively.

As shown in FIG. 2 to FIG. 4, according to an XY plane constructed by the X axis and the Y axis that is defined between the outlet 211 of the fan 21 and the air outlet 31 of the housing, and a space defined on the XY plane along the Z axis between the housing 30 and the circuitboard 20, an enclosed area can be achieved by the enclosure of the fan 21, the circuitboard 20, the wall element 27 and the housing 30, which is a wind channel used for defining the air flow to flow out of the outlet 211 of the fan 21 toward the air outlet 31 of the housing 30. Considering the space limitation and availability inside electronic devices, a smaller circuitboard 20 can be adopted for allowing only the heating element 23 to be disposed thereon while enabling the fan 21, the heat dissipating fin 24 and the wall element 27 to be mounted on the inner wall of the housing 30. Thereby, a similar enclosed area can also be achieved using the fan 21, the wall element 27 and the inner wall of the housing 30, that can also be a wind channel used for defining the air flow to flow out of the outlet 211 of the fan 21 toward the air outlet 31 of the housing 30. In this embodiment, the heat dissipating fin 24, the heating element 23 and the wall element 27 are disposed on a same side of the circuitboard 22. The heat dissipating fin 24 and the heating element 23 can be disposed in two circuitboards separately in one of embodiments. The wall element 27 or the heat dissipating fin 24 can be disposed on an inner side of the housing 30 in one of embodiments.

Figure 6:
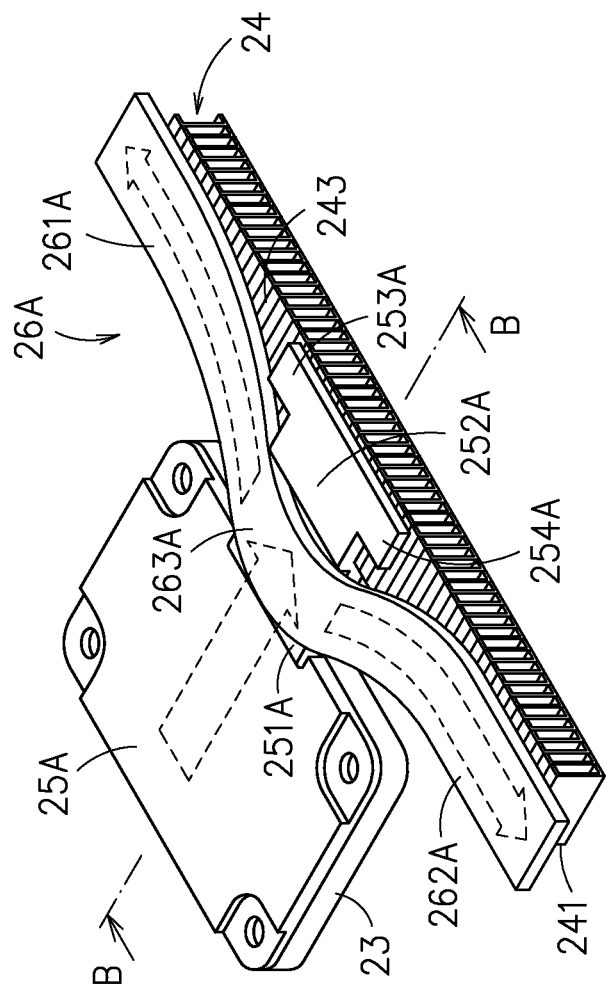
FIG. 6 is a three-dimensional view of a heat dissipating module with a heat dissipating fin and heat conductive element according to a second embodiment of the invention that is provided with a corresponding heat transfer path.
Figure 8:
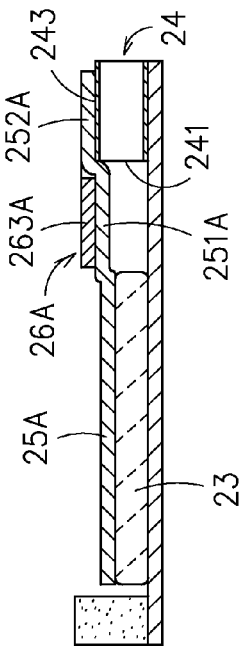
FIG. 8 is a B-B cross sectional view of FIG. 6.
Figure 7:
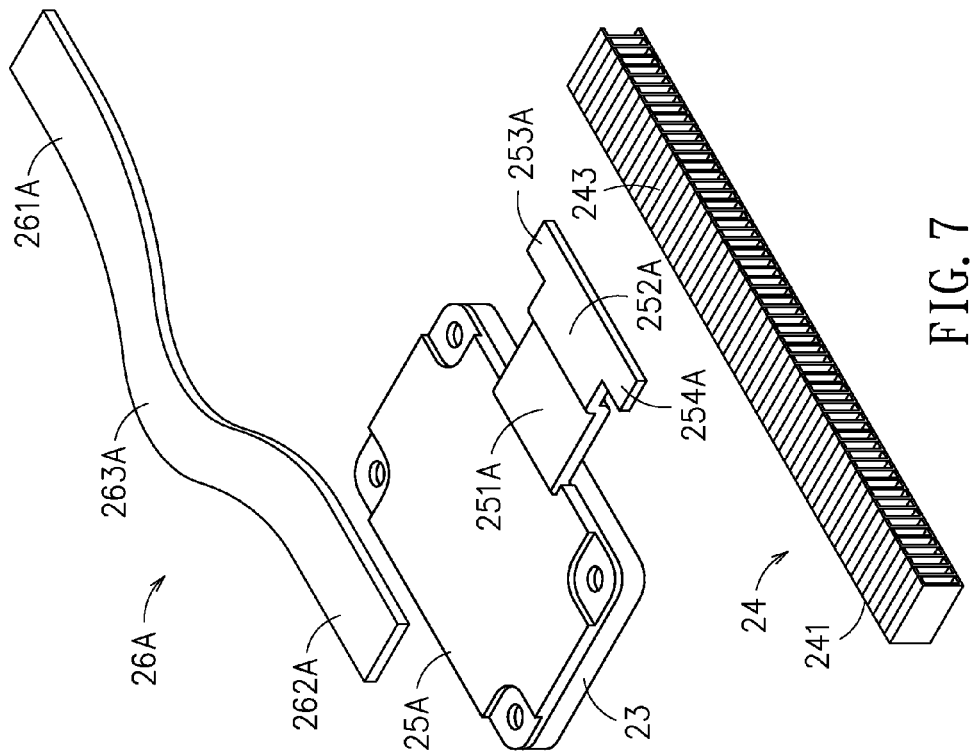
FIG. 7 is an exploded diagram showing a heat dissipating fin and a heat conducting element that are used in the second embodiment of FIG. 6.

As shown in FIG. 6 to FIG. 8, the heat conducting element is composed of a panel 25A and a bar-like piece 26A. It is noted that both the panel 25A can be made of a conductive material. As shown in FIG. 6, the panel 25A is disposed for allowing the same to engage with the heating element 23 by a side thereof. The panel 25A includes a first extension part 251A, which is formed extending from a side of the panel 25A toward the air intake side 241 of the heat dissipating fin 24 by a specific length. Moreover, the first extension part 251A further comprises: a second extension part 252A, which is formed at a side of the first extension part 251A that is opposite to the panel 25A for allowing the same to engage with the heat dissipating fin 21 at a surface where the two ends 261A, 262A of the bar-like piece 26A are engaged thereat, i.e. the first surface 243 of the heat dissipating fin 24. In addition, the second extension part 252A is formed with two winged pieces 253A, 254A respectively at two opposite sides thereof at positions neighboring to the side of the second extension part 252A that is engaged with the first extension part 251A; and together the assembly of the second extension part 252A and the two winged pieces 253A, 254A forms a T-shaped object while allowing the two winged pieces 253A, 254A to be arranged engaging with the first surface 243 of the heat dissipating fin 24. Similarly, the two ends 261A, 262A are arranged in contact with the heat dissipating fin 24 and the convex part 263A is arranged protruding out of the heat dissipating fin 24 so as to engage with the first extension part 251A of the panel 25A. As shown in FIG. 6, the heat generated from the heating element 23 is conducted to the panel 25A so as to be further transferred sequentially to the first extension part 261A, the convex part 263A, and the second extension part 252A, and then, the heat being conducted to the convex part 263A is divided and then to be conducted respectively to the two ends 261A, 262A of the bar-like piece 26A so as to be further transferred to the heat dissipating fin 24, and simultaneously the heat being conducted to the second extension part 252A is further being divided and then to be conducted respectively to the two winged pieces 253A, 254A so as to be further transferred to the heat dissipating fin 24. Overall, a Y-shaped heat transfer path can be achieved, as the dotted arrows in FIG. 6. Thereby, the heat generated from the first surface 243 of the heating element 23 can be conducted to the heat dissipating fin 24 evenly and rapidly.

Figure 10:
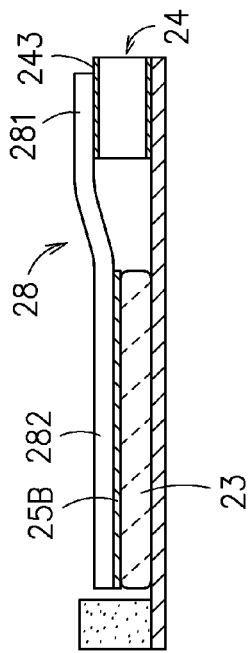
FIG. 10 is a C-C cross sectional view of FIG. 9.
Figure 11:
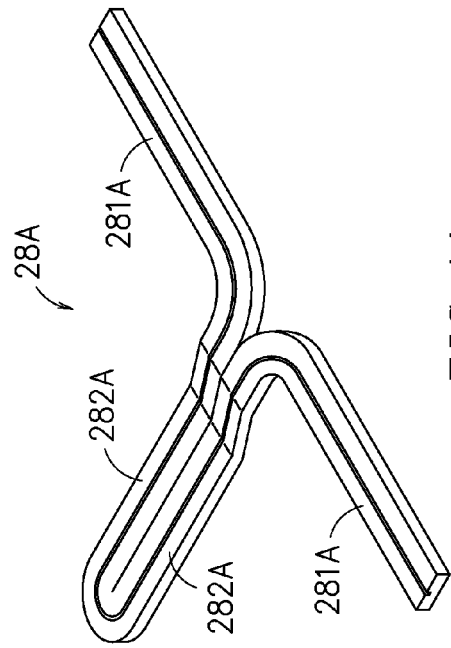
FIG. 11 is a schematic view of a conductive bar used in the present invention.
Figure 9:
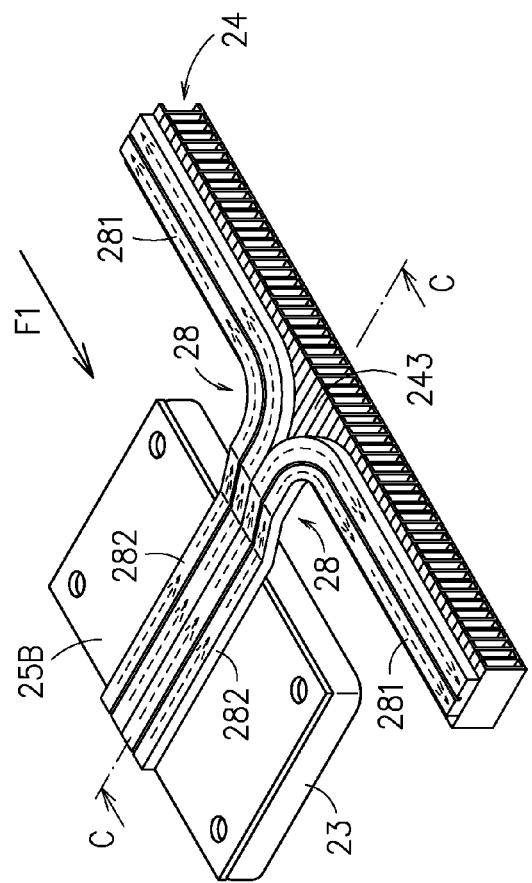
FIG. 9 is a three-dimensional view of a heat dissipating module with a heat dissipating fin and heat conductive element according to a third embodiment of the invention that is provided with a corresponding heat transfer path.

Please refer to FIG. 9 and FIG. 10, which are schematic diagrams showing a heat dissipating module with a heat dissipating fin and heat conductive element according to a third embodiment of the invention. In this embodiment, the heat conducting element is composed of a panel 25B and two conductive bars 28. Similarly, the panel 25B and the two conductive bars 28 can be made of conductive material, and further the conductive bars 28 should be flexible and can be the thermal tubes commonly seen in conventional heat dissipating modules. The panel 25B is disposed for allowing the same to engage with the heating element 23 by a side thereof. In this embodiment, the two conductive bars 28 are symmetrically arranged and each of the two conductive bars 28 is configured with a contact part 281 and a bending part 282 in a manner that the contact parts of the two symmetrically arranged conductive bars 28 are disposed on and engaged with the first surface 243 of the heat dissipating fin 24 in a direction parallel to the first direction F1 while allowing the bending parts 282 to protruding out of the heat dissipating fin 24 so as to be in contact with the panel 25B. Moreover, the two bending parts 282 of the two conductive bars 28 are arranged proximate to and parallel with each other. Thereby, the heat generated from the heating element 23 is first being conducted to the panel 25Bm where it is divided and then to be conducted respectively to the two bending parts 282 so as to be further conducted to their respectively contact parts 281, and finally the heat can be conducted to the heat dissipating fin 24 through the two contact parts 281, as the dotted arrows shown in FIG. 9. As the conductive bars 28 are flexible, it is possible of constructed a one-piece conductive bar 28A, as shown in FIG. 11, by integrating the two conductive bars 28 into one piece. As shown in FIG. 11, the one-piece conductive bar 28A is configured with two contact parts 281A and two bending parts 282A, whereas the two bending parts 282A are connected to each other at the ends thereof that are not connected to their corresponding contact parts 281A.

From the above embodiments, the heat dissipating module of the present invention is characterized in that: the heat conducting element is composed of a first conductive component and two second conductive components in a manner that the first conductive component, being disposed at a position between the two second conductive components, is disposed engaging with the heating element while allowing the two second conductive components to engage with the heat dissipating fin, and allowing the heat conducting element to be spaced from the fan by a second distance; and moreover, the two second conductive components are arranged for enabling the two to face each other in an end-to-end manner while allowing the first conductive component to connected to the two ends of the second conductive components that are arranged face to face. Thereby, the heat generated from the heating element is conducted first to the first conductive component, where it is divided and then to be conducted respectively to the two second conductive components so as to be further conducted to the heat dissipating fin, forming a Y-shaped heat transfer path. For the first embodiment shown in FIG. 2 to FIG. 5 whose heat conducting element is composed of the panel 25 and the bar-like piece 26, the panel 25 is to be used as the first conductive component, and the two ends 261, 262 of the bar-like piece 26 are to be used respectively as the two second conductive components. Moreover, the panel 25 is connected to the convex part 263 of the bar-like piece 26 by the first extension part 251, forming a heat transfer path all the way form the panel 25 to the two ends 261, 262. For the second embodiment shown in FIG. 6 to FIG. 8 whose heat conducting element is composed of the panel 25A and the bar-like piece 26A, the panel 25A is to be used as the first conductive component, and the two ends 261A, 262A of the bar-like piece 26A are to be used respectively as the two second conductive components. Moreover, the panel 25A is connected to the convex part 263A of the bar-like piece 26A by the first extension part 251A, forming a heat transfer path all the way form the panel 25A to the two ends 261A, 262A. For the third embodiment shown in FIG. 9 to FIG. 10 whose heat conducting element is composed of the panel 25B and conductive bars 28, the panel 25B is to be used as the first conductive component, and the two contact parts 281 of the conductive bars 28 are to be used respectively as the two second conductive components. Moreover, the panel 25B is conductively connected to the two contact parts 281 through the two bending parts 282. It is noted that although in all the aforesaid embodiments, the first conductive component and the assembly of the two second conductive components are designed as two independent parts that are disposed separately and independently, they can be integrally formed as a one-piece part. For instance, the panel 25 and the bar-like piece 26 used in the embodiment shown in FIG. 2 to FIG. 5 can be integrally formed into a one-piece part. Nevertheless, considering the manufacturing factors in all aspect including dimensional tolerance, assembly error and process complexity, in most cases, the panel 25 and the bar-like piece 26 are generally being designed as two independent parts.

To sum up, the present invention providse a heat dissipating module with specific heat transfer path design, capable of enabling the heat generated from a heating element to be dividedly conducted in a Y-shaped heat transfer path to a heat dissipating, resulting that not only the heat transfer path between the heating element and the heat dissipating fin is shortened, but also the distance between the heat dissipating fin and a fan corresponding thereto is reduced, and thereby, allowing the heat emitted from the heating element to be transferred more rapidly and evenly to the heat dissipating fin so as to improve the overall performance of the heat dissipating module and also create a compact heat dissipating module that occupies less space.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A heat dissipating module, received inside a housing of an electronic device whereas the electronic device is composed of at least one circuitboard and a heating element, and the housing is formed with at least one air outlet, the heat dissipating module comprising:

a fan, providing an air flow in a direction parallel to a first direction;

a heat dissipating fin, configured with an air intake side, an air outlet side and a first surface in a manner that the air intake side and the air outlet side are arranged opposite to each other while allowing the first surface to be disposed neighboring to both the air intake side and the air outlet side, allowing an included angle between an normal vector of the air intake side and the first direction, allowing the air outlet side to face toward the air outlet, and enabling the dissipating fin to be spaced from the fan by a first distance;

a heat conducting element, made of a material with heat conductivity, and composed of a first conductive component and two second conductive components in a manner that the first conductive component, being disposed at a position between the two second conductive components, is disposed engaging with the heating element while allowing the two second conductive components to engage with the first surface of the heat dissipating fin, and allowing the heat conducting element to be spaced from the fan by a second distance; and a wall element, mounted on the circuitboard for working with the housing and the circuitboard so as to form an area walling the heating element, the heat dissipating fin and the heat conducting element therein;

wherein, the heat from the heating element is conducted to the first conductive component where it is further being dividedly conducted to the two second conductive components and then to the heat dissipating fin; and the air flow blowing from the fan is guided to the heating element and the first conductive component and then it is blocked and guided by the wall element for diverting the air flow to flow toward the air intake side of the heat dissipating fin and then to an air outlet side thereof so as to be discharged out of the heat dissipating module through the air outlet;

wherein the heat conducting element is composed of a panel that is to be used as the first conductive component and a bar-like piece that is to be used as an assembly of the two second conductive components, and the panel is arranged for enabling a surface thereof to engage with the heating element, and the bar-like piece, being configured with two opposite ends, is formed with a convex part at a position between the two ends while allowing the two ends to be in contact with the heat dissipating fin and the convex part protruding out of the heat dissipating fin so as to engage with the panel, wherein the panel includes a first extension part, being formed extending from a side of the panel toward the air intake side of the heat dissipating fin so as to engage with the convex part of the bar-like piece, wherein the first extension part is formed extending from the panel to the air intake side of the heat dissipating fin.

2. A heat dissipating module, received inside a housing of an electronic device whereas the electronic device is composed of at least one circuitboard and a heating element, and the housing is formed with at least one air outlet, the heat dissipating module comprising:

a fan, providing an air flow in a direction parallel to a first direction;

a heat dissipating fin, configured with an air intake side, an air outlet side and a first surface in a manner that the air intake side and the air outlet side are arranged opposite to each other while allowing the first surface to be disposed neighboring to both the air intake side and the air outlet side, allowing an included angle between an normal vector of the air intake side and the first direction, allowing the air outlet side to face toward the air outlet, and enabling the dissipating fin to be spaced from the fan by a first distance;

a heat conducting element, made of a material with heat conductivity, and composed of a first conductive component and two second conductive components in a manner that the first conductive component, being disposed at a position between the two second conductive components, is disposed engaging with the heating element while allowing the two second conductive components to engage with the first surface of the heat dissipating fin, and allowing the heat conducting element to be spaced from the fan by a second distance; and a wall element, mounted on the circuitboard for working with the housing and the circuitboard so as to form an area walling the heating element, the heat dissipating fin and the heat conducting element therein;

wherein, the heat from the heating element is conducted to the first conductive component where it is further being dividedly conducted to the two second conductive components and then to the heat dissipating fin, and the air flow blowing from the fan is guided to the heating element and the first conductive component and then it is blocked and guided by the wall element for diverting the air flow to flow toward the air intake side of the heat dissipating fin and then to an air outlet side thereof so as to be discharged out of the heat dissipating module through the air outlet, wherein the heat conducting element is composed of a panel that is to be used as the first conductive component and a bar-like piece that is to be used as an assembly of the two second conductive components, and the panel is arranged for enabling a surface thereof engage with the heating element, and the bar-like piece, being configured with two opposite ends, is formed with a convex part at a position between the two ends while allowing the two ends to be in contact with the heat dissipating fin and the convex part protruding out of the heat dissipating fin so as to engage with the panel, wherein the panel includes a first extension part, being formed extending from a side of the panel toward the air intake side of the heat dissipating fin so as to engage with the convex part of the bar-like piece, wherein the first extension part further comprises: a second extension part, being formed at a side of the first extension part that is opposite to the panel for allowing the same to engage with the heat dissipating fin on the first surface where the two ends of the bar-like piece are engaged thereat.

3. The heat dissipating module of claim 2, wherein the second extension part is formed with two winded pieces respectively at two opposite sides thereof at positions neighboring to the side of the second extension part that is engaged with the first extension part; and the two winged pieces are arranged engaging with the heat dissipating fin on the first surface.

4. The heat dissipating module of claim 1, wherein the heat dissipating fin, the heating element and the wall element are disposed on a same side of the circuitboard.

5. The heat dissipating module of claim 1, wherein the number of the first distance or the second distance is not zero.

6. The heat dissipating module of claim 2, wherein the heat dissipating fin, the heating element and the wall element are disposed on a same side of the circuitboard.

7. The heat dissipating module of claim 2, wherein the number of the first distance or the second distance is not zero.

* * * * *